(12) United States Patent
Rotondaro et al.

(10) Patent No.: US 7,045,431 B2
(45) Date of Patent: May 16, 2006

(54) METHOD FOR INTEGRATING HIGH-K DIELECTRICS IN TRANSISTOR DEVICES

(75) Inventors: Antonio L. P. Rotondaro, Dallas, TX (US); Douglas E. Mercer, Richardson, TX (US); Luigi Colombo, Dallas, TX (US); Mark Robert Visokay, Richardson, TX (US); Haowen Bu, Plano, TX (US); Malcolm John Bevan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/738,958

(22) Filed: Dec. 17, 2003

(65) Prior Publication Data

US 2005/0136589 A1    Jun. 23, 2005

(51) Int. Cl.
*H01L 21/336* (2006.01)
(52) U.S. Cl. ................................. 438/287; 438/303
(58) Field of Classification Search ............... 438/287, 438/299, 303
See application file for complete search history.

(56) References Cited

U.S. PATENT DOCUMENTS

| | | | |
|---|---|---|---|
| 6,504,214 B1 * | 1/2003 | Yu et al. ..................... | 257/347 |
| 6,544,906 B1 | 4/2003 | Rotondaro et al. | |
| 6,656,852 B1 | 12/2003 | Rotondaro et al. | |
| 6,657,267 B1 * | 12/2003 | Xiang et al. ................ | 257/410 |
| 6,713,357 B1 * | 3/2004 | Wang et al. ................ | 438/287 |
| 6,777,283 B1 * | 8/2004 | Maeda ........................ | 438/231 |
| 6,841,831 B1 * | 1/2005 | Hanafi et al. ............... | 257/369 |
| 6,869,868 B1 * | 3/2005 | Chiu et al. .................. | 438/592 |
| 2003/0129817 A1 | 7/2003 | Visokay et al. | |

OTHER PUBLICATIONS

"Carrier Mobility in MOSFETs Fabricated With Hf-Si-O-N Gate Dielectric, Polysilicon Gate Electrode, and Self-Aligned Source and Drain", A.L.P. Rotondaro, M.R. Visokay, A. Shanware, J.J. Chambers and L. Colombo, IEEE Electron Device Letters, vol. 23, No. 10, Oct. 2002, 3 pp.
"Advanced CMOS Transistors with a Novel HfSiON Gate Dielectric", A.L.P. Rotondaro, M.R. Visokay, J.J. Chambers, A. Shanware, R. Khamankar, H. Bu. R.T. Laaksonen, L. Tsung, M. Douglas, R. Kuan, M.J. Bevan, T. Grider, J. McPherson and L. Colombo, Symposium on VLSI Technology (Honolulu, HI) 2002, 2 pp.

* cited by examiner

*Primary Examiner*—Christian D. Wilson
(74) *Attorney, Agent, or Firm*—Jacqueline J. Garner; W. James Brady, III; Frederick J. Telecky, Jr.

(57) ABSTRACT

Methods are disclosed that fabricating semiconductor devices with high-k dielectric layers. The invention removes portions of deposited high-k dielectric layers not below gates and covers exposed portions (e.g., sidewalls) of high-k dielectric layers during fabrication with an encapsulation layer, which mitigates defects in the high-k dielectric layers and contamination of process tools. The encapsulation layer can also be employed as an etch stop layer and, at least partially, in comprising sidewall spacers. As a result, a semiconductor device can be fabricated with a substantially uniform equivalent oxide thickness.

19 Claims, 8 Drawing Sheets

US 7,045,431 B2

METHOD FOR INTEGRATING HIGH-K DIELECTRICS IN TRANSISTOR DEVICES

FIELD OF INVENTION

The present invention relates generally to semiconductor devices and more particularly to methods for fabricating high-k dielectrics and integrating high-k dielectrics into semiconductor device fabrication.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by growing silicon dioxide ($SiO_2$) over a silicon wafer surface, with doped polysilicon formed over the $SiO_2$ to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, there are electrical and physical limitations on the extent to which thickness of $SiO_2$ gate dielectrics can be reduced. For example, very thin $SiO_2$ gate dielectrics are prone to large gate tunneling leakage currents resulting from direct tunneling through the thin gate oxide. In addition, there are conventional limitations on the ability to form such thin oxide films with uniform thickness. Furthermore, thin $SiO_2$ gate dielectric layers provide a poor diffusion barrier to dopants, for example, and may allow high boron dopant penetration into the underlying channel region of the silicon during device fabrication.

Recent MOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

The performance and reliability of the resulting MOS transistors is dependent upon the quality of the high-k gate dielectric material, including the bulk high-k material and also the quality of the interface region between the high-k gate dielectric material and the underlying silicon. Unlike $SiO_2$, which may be formed by thermal oxidation (growth process), high-k dielectrics are typically deposited over the semiconductor substrate, using chemical vapor deposition (CVD), physical vapor deposition (PVD), atomic layer deposition (ALD), molecular beam epitaxy (MBE), or other deposition processes. While the macroscopic composition (e.g., stoichiometry) of these materials may be controlled to a certain extent during such deposition processes, stoichiometric composition variations within the film may degrade device performance.

In addition, the above deposition techniques often create high-k dielectric films having defects that affect transistor performance. Such defects may include oxygen vacancies, and/or other point defects affecting leakage through the gate dielectric. Furthermore, certain deposition processes (e.g., CVD, ALD, etc.) may introduce impurities (e.g., C, OH, H, etc.) into the deposited high-k dielectric film, which also degrade device performance. Moreover, the deposited film may not be of optimal density, wherein sub par performance may result in absent atomic rearrangement or realignment. Accordingly, there is a need for improved gate dielectric fabrication techniques by which high quality gate dielectrics and interfaces can be achieved.

The integration of high-k films into the CMOS fabrication flow poses significant challenges. All high-k films under investigation have in their composition one or more metallic elements that are not currently being used during the front end of the line portion of the device fabrication flow (e.g. Hf, Zr, Al, La, Y, Ba, Sr, Ti, Gd, Ta, Nb, Pb, Bi among others). The presence of a new metallic element on the wafer surface at an early stage of the device fabrication flow, as it is the case when high-k films are used as the gate dielectric of a CMOS device, poses a significant threat of cross contamination for the FEOL processes and tools. In particular, wet treatments and thermal processes can be jeopardized by metallic contamination. It is desirable that the introduction of high-k to the CMOS fabrication lines does not disrupt other processes. Moreover, it is desirable that the wet and thermal treatments used for CMOS device fabrication do not degrade the high-k films. An approach to integrate high-k films to the CMOS fabrication flow that mitigates the risk of cross contamination of the fabrication line and that mitigates the degradation of the high-k film is desirable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides systems and methods that facilitate semiconductor fabrication by integrating high-k dielectric layers into a process flow. The invention removes portions of deposited high-k dielectric layers not below gates and covers exposed portions (e.g., sidewalls) of high-k dielectric layers during fabrication with an encapsulation layer, which mitigates defects in the high-k dielectric layers and contamination of process tools. The encapsulation layer can also be employed as an etch stop layer and, at least partially, in comprising sidewall spacers.

A device of the present invention is fabricated by forming a high-k dielectric layer over a semiconductor substrate. An electrode material, such as polysilicon, is then formed on the high-k dielectric layer. The electrode material and the dielectric layer are then patterned, in separate patterning processes in one example, to form gate structures. The exposed high-k at the sidewall is encapsulated. Subsequently, extension regions are formed. In contrast, conventional devices typically form extension regions without patterning the dielectric layer. Other processing, including sidewall spacer formation and source/drain implants, are also performed. As a result, a semiconductor device can be fabricated with a substantially uniform equivalent oxide thickness.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
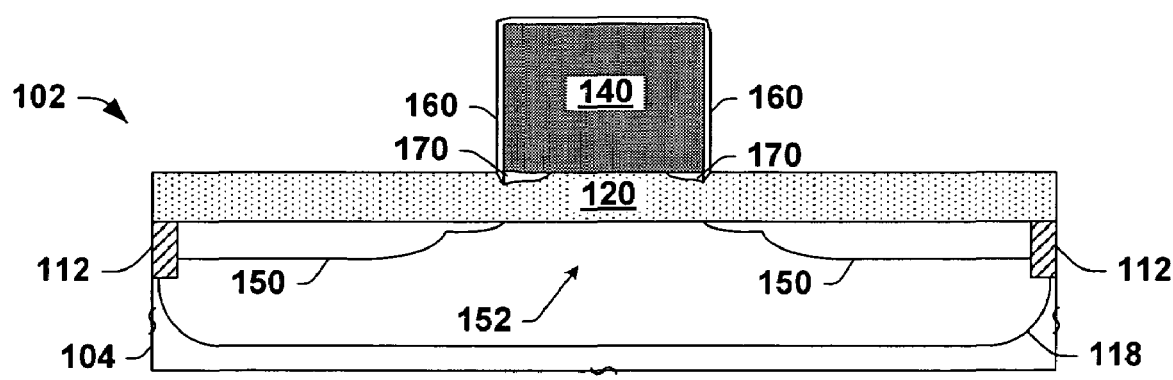
FIG. 1 is a cross sectional view illustrating a conventional MOS transistor device and defects that can be introduced by the fabrication process.

One or more implementations of the present invention will now be described with reference to the attached drawings, wherein like reference numerals are used to refer to like elements throughout, and wherein the devices and structures illustrated in the figures are not necessarily drawn to scale.

The present invention provides systems and methods that facilitate semiconductor fabrication by integrating high-k dielectric layers into a process flow. The invention removes portions of deposited high-k dielectric layers not below gates (e.g., source/drain regions) and covers exposed portions (e.g., sidewalls) of high-k dielectric layers during fabrication with an encapsulation layer, which mitigates defects in the high-k dielectric layers and contamination of process tools. The encapsulation layer can also be employed as an etch stop layer and, at least partially, in comprising sidewall spacers.

Semiconductor fabrication processes for conventional metal oxide semiconductor (MOS) devices and conventional complementary metal oxide semiconductor (CMOS) devices that employ high-k dielectrics can create defects in the dielectrics that negatively impact performance of these devices. FIG. 1 is a cross sectional view illustrating a conventional MOS transistor device and defects that can be introduced by the fabrication process. Isolation structures 112 and well regions 118 are formed in a semiconductor substrate 104. A high-k dielectric layer 120 is formed on the semiconductor substrate 104 by depositing a high-k dielectric material over the device. Then, polysilicon is deposited on the high-k dielectric and etched to form a polysilicon gate 140 on the high-k dielectric layer 120. However, the high-k dielectric layer 120 is not substantially etched and remains exposed in areas not covered by the polysilicon gate 140.

Subsequently, a liner oxide 160 is grown by a suitable polysilicon oxidation process. As a result, a number of problems can occur. Generally, the high-k dielectric material facilitates oxide growth in any process that include oxygen in the process or atmosphere. Growing the liner oxide 160 can therefore result in undesirable oxide formation on or in an interface between the high-k dielectric layer 120 and the polysilicon gate 140, resulting in unwanted oxide or birdbeak like regions 170. These oxide regions 170 can alter the equivalent oxide thickness (EOT) of the high-k dielectric layer 120 from a desired/selected value, thereby negatively impacting device operation and performance. Additionally, unwanted oxide regions can also be formed below the high-k dielectric layer 120 in the substrate.

It is appreciated by the inventors of the present invention that exposed portions of the high-k dielectric layer 120 also can degrade semiconductor fabrication tools (not shown) by, for example, introducing contaminants to the fabrication tools during the liner oxide 160 formation and in later processing. Finally, the exposed portions of the high-k dielectric layer 120 can also be contaminated by later processing steps, including source/drain regions 150 formation and annealing operations. Sidewall spacers (not shown) are also typically formed.

Figure 2:
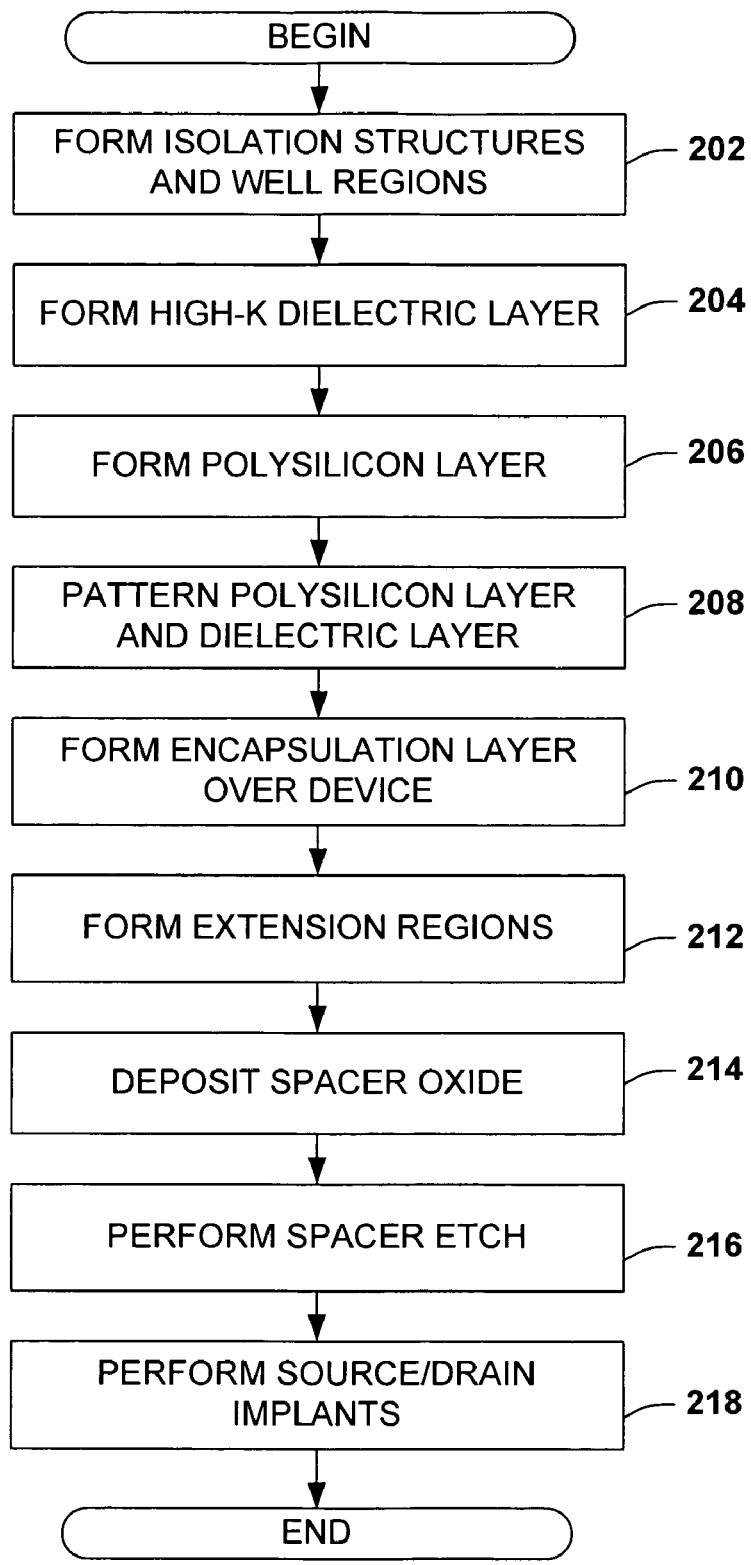
FIG. 2 is a flow diagram of a method of fabricating a semiconductor device with an encapsulated high-k dielectric layer in accordance with an aspect of the present invention.

Turning now to FIG. 2, a flow diagram of a method for fabricating a semiconductor device with an encapsulated high-k dielectric layer in accordance with an aspect of the present invention is provided. By being encapsulated, the dielectric layer is less susceptible to some defects, and contamination of process tools can be mitigated.

The method of FIG. 2 is discussed in conjunction with FIGS. 3A to 3I for illustrative purposes. These figures are provided as exemplary views of a device being fabricated in accordance with the method of FIG. 2. It is appreciated that variations of the method are permitted in accordance with the present invention. Furthermore, it is appreciated that such variations can result in fabrication of structures and/or layers different than those indicated in FIGS. 3A to 3I.

The method begins at block 202, wherein isolation structures and well regions are formed within a semiconductor substrate. The isolation structures formed are suitable structures that can isolate individual transistors on a device such as shallow trench isolation (STI) regions and field oxide (LOCOS) isolation regions. The well regions are formed via suitable implantation procedures that selectively implant n-type or p-type dopants with a dose and energy to create the well regions.

Figure 3A:
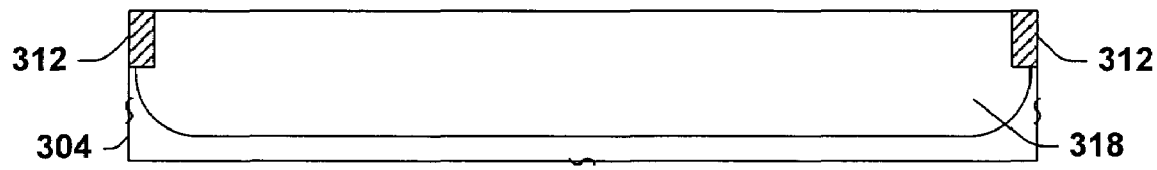
FIG. 3A is an exemplary cross sectional view of the semiconductor device after formation of the isolation structures and well regions in accordance with an aspect of the present invention.

FIG. 3A is an exemplary cross sectional view of the semiconductor device after formation of the isolation structures and well regions in accordance with an aspect of the present invention. FIG. 3A shows the isolation structures 312 and well regions 318 formed within a semiconductor substrate 304.

A high-k dielectric layer is then formed on the device at block 204. Prior to deposition, a suitable surface preparation is performed. Unlike $SiO_2$, which may be formed by thermal oxidation (growth process), the high-k dielectric layer is formed by depositing a high-k dielectric material over the semiconductor substrate, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the dielectric layer. High-k dielectric materials have dielectric constants that are greater than that of $SiO_2$ (e.g., greater than about 3.9). As a result, the high-k dielectric layer can be formed in a thicker layer than scaled $SiO_2$, and yet produce equivalent field effect performance. The relative electrical performance of such high-k dielectric materials is often expressed as EOT, because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Any suitable dielectric may be deposited at block 204 having a dielectric constant higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates. The dielectric may further include metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc. The dielectric may also include, for example perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Figure 3B:
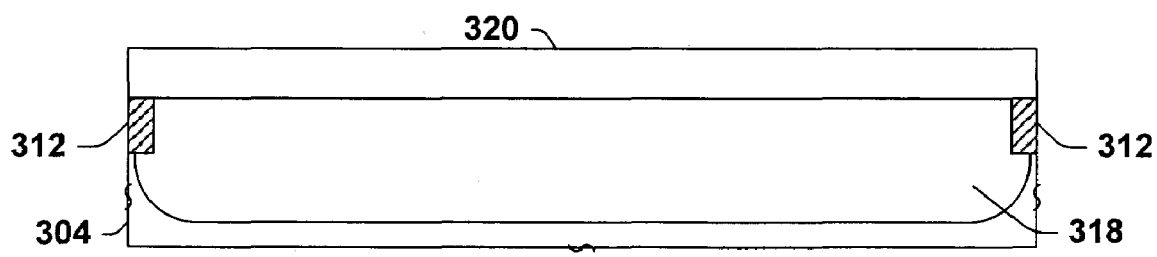
FIG. 3B is an exemplary cross sectional view of a semiconductor device after formation of a high-k dielectric layer in accordance with an aspect of the present invention.

FIG. 3B is an exemplary cross sectional view of the semiconductor device after formation of the high-k dielectric layer 320 in accordance with an aspect of the present invention. The dielectric layer 320 is shown formed on the device with an actual thickness that is greater than a corresponding silicon dioxide layer would be required to be. For example a 30 Angstrom thick layer of a high-k dielectric with dielectric constant equal to 12 can be used to create an EOT of 10 Angstroms.

Figure 3C:
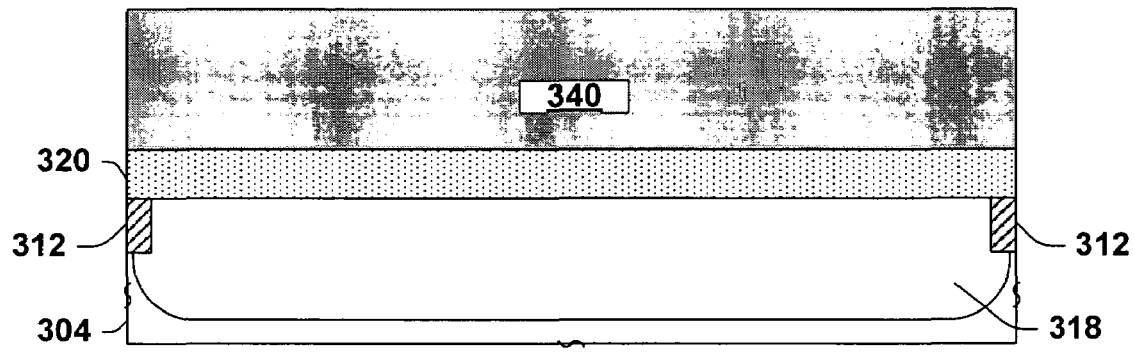
FIG. 3C is an exemplary cross sectional view of a semiconductor device after formation of a polysilicon layer in accordance with an aspect of the present invention.

Continuing with the method of FIG. 2, a polysilicon layer is formed on the high-k dielectric layer at block 206. The polysilicon layer is formed by depositing a polysilicon material over the device by a suitable deposition process, such as CVD, PVD, or ALD. The material can be doped or undoped. FIG. 3C is another exemplary cross sectional view of the semiconductor device in accordance with an aspect of the present invention after formation of the polysilicon layer 340 on the high-k dielectric layer 320.

Figure 3D:
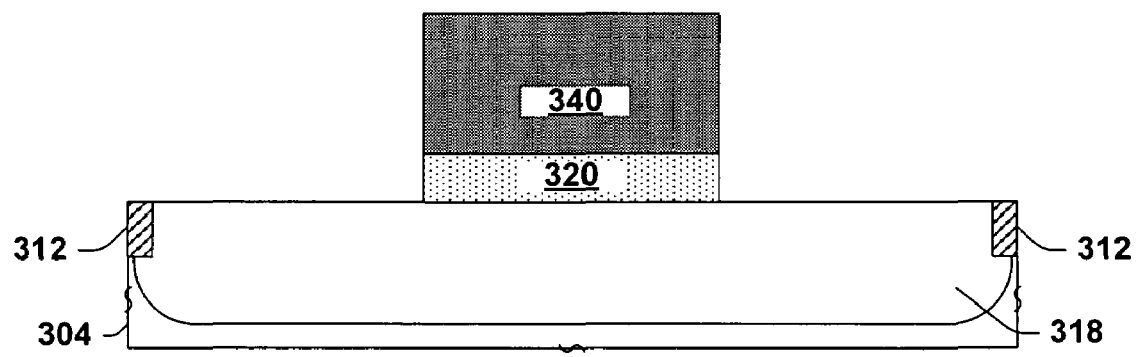
FIG. 3D is an exemplary cross sectional view of a semiconductor device after formation of the gate structures in accordance with an aspect of the present invention.

The polysilicon layer 340 and the high-k dielectric layer 320 are both patterned at block 208 to form gate structures, wherein the remaining portions of the polysilicon layer 340 and the high-k dielectric layer 320 form the gate structures. FIG. 3D is an exemplary cross sectional view of the semiconductor device after formation of the gate structures in accordance with an aspect of the present invention. A suitable mask and etch process (e.g., reactive ion etching) are employed to pattern layer 340. Subsequently an etch process (dry or wet) is used to pattern layer 320. In one aspect, the etch process is a wet etch as described on U.S. Pat. No. 6,656,852 assigned to the assignee of the present invention, Texas Instruments Incorporated, the entirety of which is hereby incorporated by reference as if fully set forth herein. In contrast with conventional devices and fabrication processes, the high-k dielectric material is removed above future source/drain regions. It is appreciated that the patterning can comprise multiple individual patterning operations. In alternate aspects of the invention, materials aside from polysilicon can be employed for the gates. Some examples of such suitable, alternate materials for the gates include metals, metal silicides, metal oxides, metal nitrides, or stack combinations thereof.

Figure 3E:
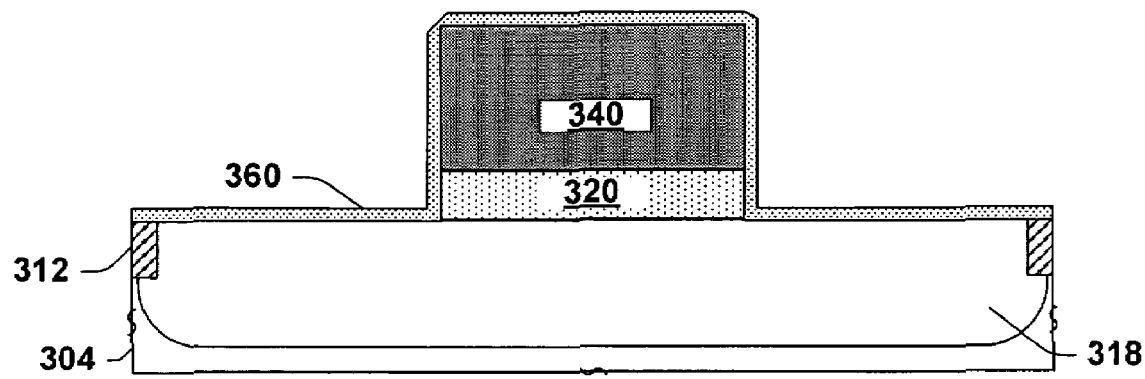
FIG. 3E is another exemplary cross sectional view of a semiconductor device after formation of an encapsulation layer in accordance with an aspect of the present invention.

An encapsulation layer is then formed on the device at block 210 after patterning. FIG. 3E is another exemplary cross sectional view of the semiconductor device after formation of the encapsulation layer 360 in accordance with an aspect of the present invention. The encapsulation layer 360 is shown substantially covering the device, including exposed side portions of the high-k dielectric layer 320. The encapsulation layer 360 is formed by depositing a relatively thin layer of $SiO_2$, Si—O—N, and/or a composite thereof. Further details on formation of the encapsulation layer 360 are provided infra.

Figure 3F:
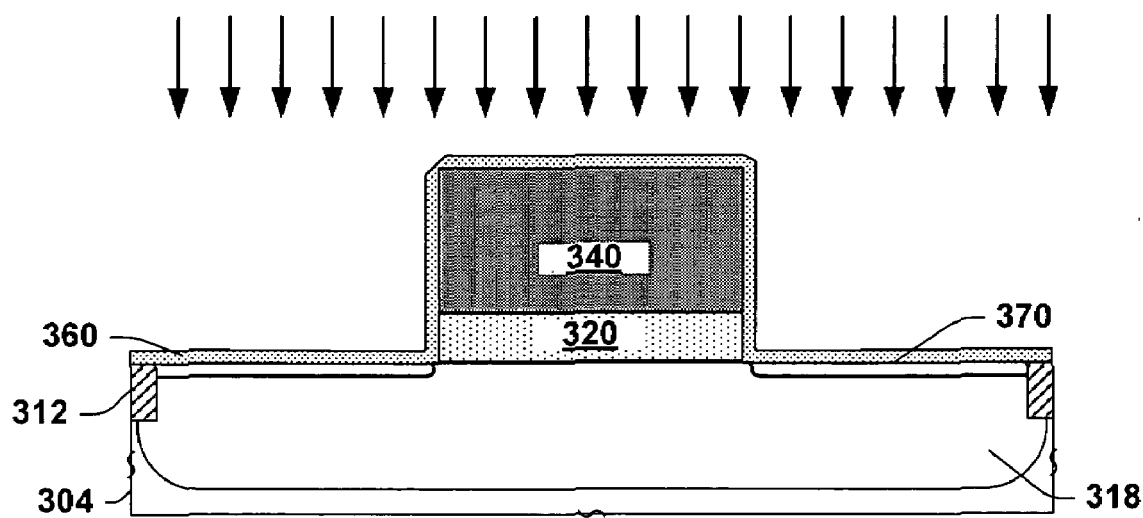
FIG. 3F is an exemplary cross sectional view of a semiconductor device after formation of extension regions in accordance with an aspect of the present invention.

Continuing with the method of FIG. 2, extension regions (e.g., lightly doped drains (LDD), moderately doped drains (MDD)), and the like are formed at block 212 by implanting a selected dopant. The extension regions are relatively shallow and are typically formed via a low energy ion implantation process. FIG. 3F is an exemplary cross sectional view of the semiconductor device after formation of the extension regions 370 in accordance with an aspect of the present invention. The presence of the encapsulation layer mitigates issues related to knock-on of high-k components during the extension implants.

Figure 3G:
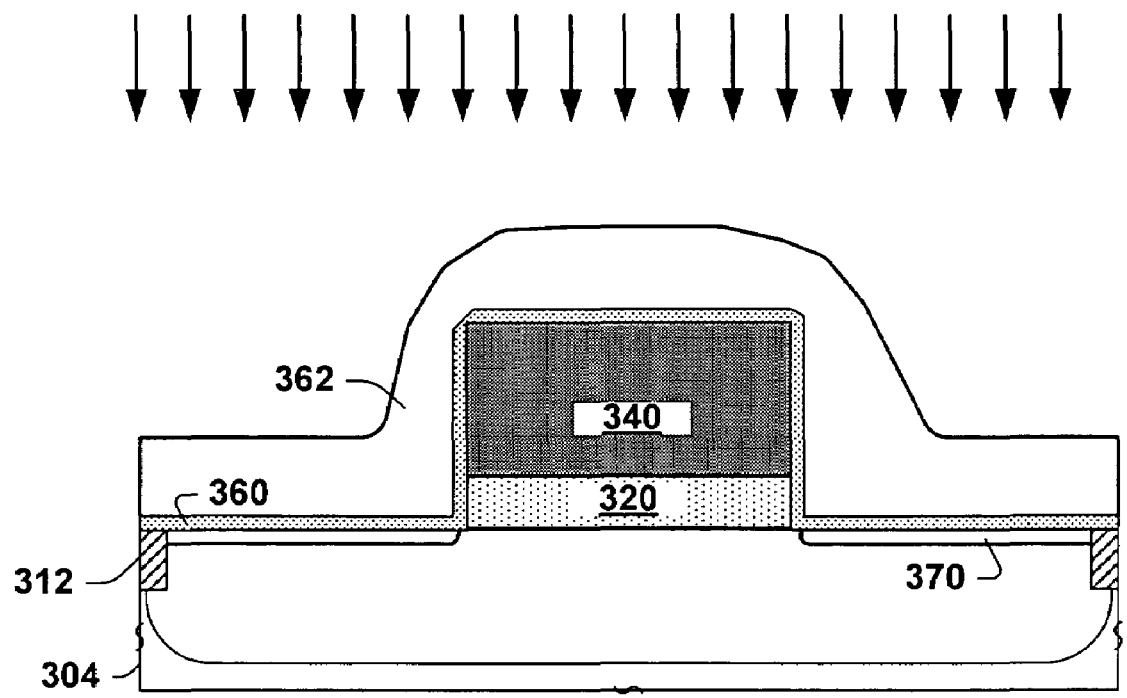
FIG. 3G is an exemplary cross sectional view of a semiconductor device after formation of a spacer oxide layer in accordance with an aspect of the present invention.

A spacer oxide is then deposited over the device at block 214. Oxide ($SiO_2$) is deposited over the device to form the spacer oxide. FIG. 3G is an exemplary cross sectional view of the semiconductor device after formation of the spacer oxide 362 in accordance with an aspect of the present invention. The spacer oxide 362 is depicted substantially covering the device. The thickness of the spacer oxide layer 362 can vary depending on the desired thickness of the resultant oxide sidewall spacers. The thickness of the sidewall spacer can be for example in the range of 300 Angstroms to 1200 Angstroms.

Figure 3H:
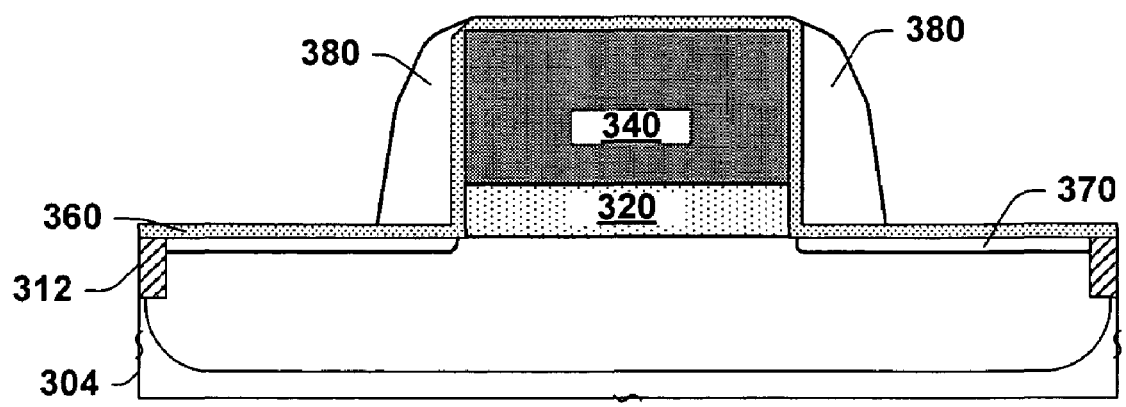
FIG. 3H is another exemplary cross sectional view of a semiconductor device after spacer formation in accordance with an aspect of the present invention.

Continuing, a spacer etch is performed at block 216 to form spacers on sidewalls of the gate structures. A suitable patterning operation is employed to form the sidewall spacers. If nitride is utilized for the encapsulation layer, the encapsulation layer can be employed as an etch stop to further facilitate fabrication of the device. FIG. 3H is another exemplary cross sectional view of the semiconductor device after spacer formation in accordance with an aspect of the present invention. The spacers 380 are illustrated as being formed along sidewalls of the gate structures.

Figure 3I:
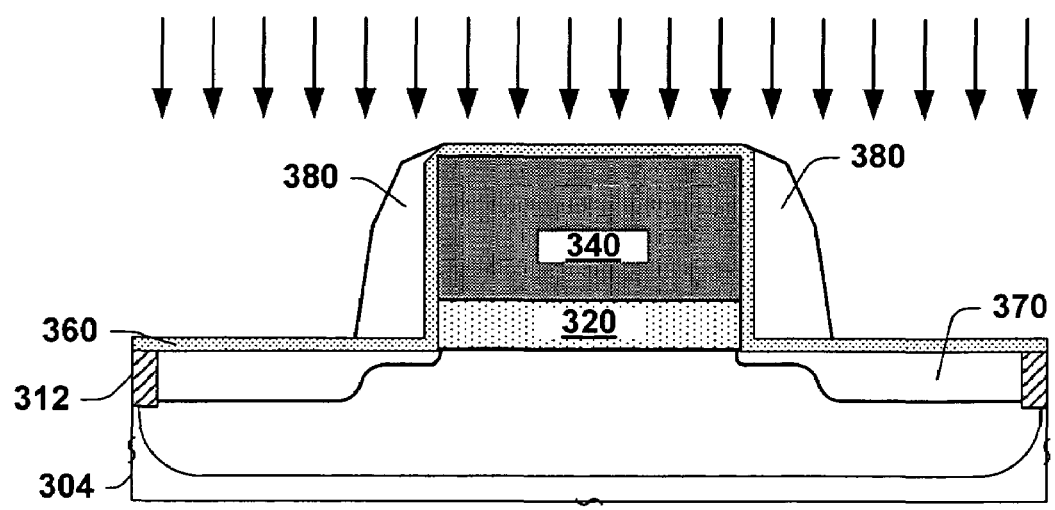
FIG. 3I is an exemplary cross sectional view of a semiconductor device after source and drain regions have been formed in accordance with an aspect of the present invention.

Source and drain implants are then performed at block 218 to form source/drain regions. The stacked gate structure serves as a mask and dopants (e.g., n-type or p-type) are selectively implanted with an energy and dose so as to achieve a desired depth for the source/drain regions. A portion of the encapsulation layer 360 may be removed prior to performing the source and drain implants, or the source/drain implant can be performed through the encapsulation layer. FIG. 3I is another exemplary cross sectional view of the semiconductor device after source and drain regions have been formed in accordance with an aspect of the present invention. The encapsulation layer 360 can mitigate issues related to knock-on of high-k components during the source/drain implants performed at block 218.

Standard processing can then be performed to complete fabrication of the device. Some other processes that can be performed include silicidation to form contacts over the gate and the source/drain regions, and metallization or interconnect processing. The encapsulation layer 360 can mitigate issues related to silicide formation in the source/drain regions 370. The encapsulation layer 360 also mitigates degradation of the high-k dielectric layer 320 during thermal processes and cross contamination from exposed high-k dielectric materials. The high-k dielectric materials, if exposed, can contaminate tools designed and/or employed for running non-high-k materials.

To further facilitate fabrication of the device and, particularly, the desired properties of the high-k dielectric layer 320, pressure and ambient composition control can be tightly controlled to mitigate moisture and oxygen contamination. Additionally, relatively fast temperature ramping (e.g., greater than about 10 degrees Celsius per second) for thermal processes can be employed. Additionally, the high-k dielectric material can be selected to be more tolerant of high temperatures and/or thermal processing (e.g., HfSiON).

Although the methodology of FIG. 2 is discussed in conjunction with FIGS. 3A to 3I, it is appreciated that FIGS. 4 and 5, below, can also be referenced to facilitate a better appreciation of the method of FIG. 2. Furthermore, for purposes of simplicity of explanation, the methodology of FIG. 2, supra, is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 4:
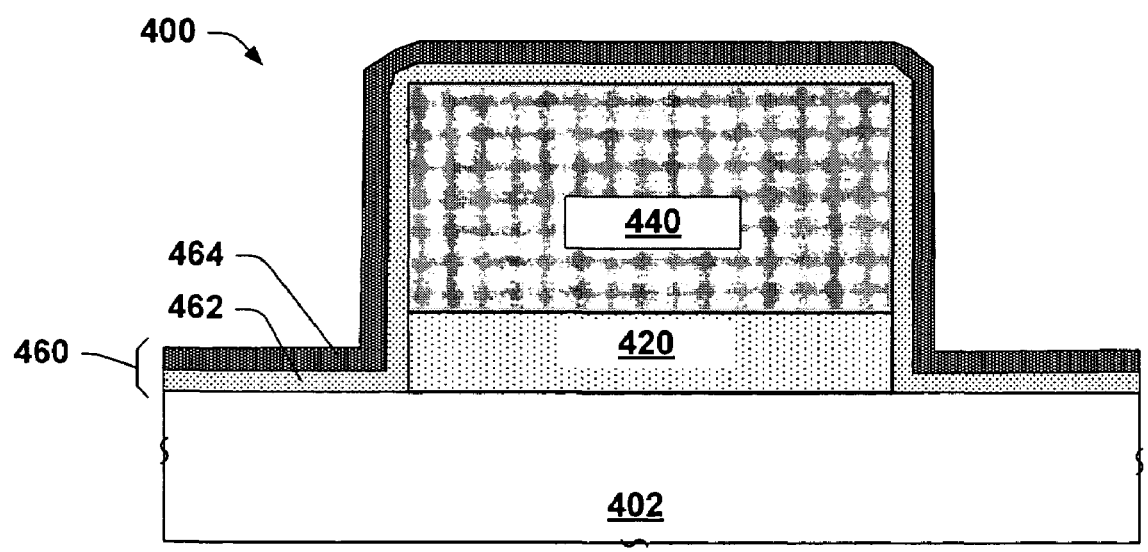
FIG. 4 is a cross sectional view illustrating a multi-layered encapsulation layer for a high-k dielectric in accordance with an aspect of the present invention.

FIG. 4 is a cross sectional view illustrating a multilayered encapsulation layer for a high-k dielectric in accordance with an aspect of the present invention. This view is somewhat simplified to illustrate this aspect of the invention. A semiconductor device 400 is depicted prior to extension region formation.

The semiconductor device 400 has a high-k dielectric layer 420 formed on a semiconductor body or substrate 402 and a gate 440 formed on the high-k dielectric layer 420. The high-k dielectric layer 420 is comprised of a high-k dielectric material, which has a dielectric constant greater than that of $SiO_2$ (e.g., greater than about 3.9) and is formed by depositing the high-k dielectric material over the semiconductor substrate using a suitable deposition process, such as, chemical vapor deposition (CVD), physical vapor deposition (PVD), atomic layer deposition (ALD), molecular beam epitaxy (MBE), and the like. The deposition process is performed so as to result in a thickness that results in a desired or selected equivalent oxide thickness (EOT) for the dielectric layer 420. The gate 440 is formed on the high-k dielectric layer 420 by depositing a suitable conductive material including, but not limited to, polysilicon, metals, metal silicides, metal oxides, metal nitrides, or stacks combinations thereof. A suitable deposition process, such as CVD, PVD, and ALD, is employed to deposit the conductive material that forms the gate 440. The material can be doped or undoped. After being deposited, the gate 440 and the high-k dielectric layer are patterned by a suitable combination of etch processes (e.g., reactive ion etching followed by wet etch) to form a gate structure as shown in FIG. 4.

A lower encapsulation layer 462 is formed on a surface of the substrate and on the gate structure. The lower encapsulation layer 462 comprises an insulative material such as silicon dioxide and is relatively. thin. The lower encapsulation layer 462, unlike a conventional liner oxide, is generally deposited by a suitable deposition (e.g., CVD or ALD) process and not grown. An upper encapsulation layer 464 is formed on the lower encapsulation layer 426. The upper encapsulation layer 464 is also relatively thin and is formed by depositing silicon nitride or silicon oxynitride. The lower encapsulation layer 462 and the upper encapsulation layer 464 together form an encapsulation layer 460, which mitigates process induced defects in the high-k dielectric layer 420, such as unwanted oxide grown, and also protects process tools from damage by exposed high-k dielectric material. The lower encapsulation layer 462 and the upper encapsulation layer 464 are relatively thin layers or films and typically have thicknesses in the range of about 10 to 200 Angstroms, respectively.

Other structures can be formed on the device 400 including, spacers, extension regions, source/drain regions, interconnects, and the like. In addition to mitigation of defects and protecting process tools, the upper encapsulation layer 464 can also be employed as an etch stop in further processing, such as spacer formation. The presence of nitride permits the upper encapsulation layer 464 to allow selective chemistries to be used while protecting underlying semiconductor substrate material and/or layers. Additionally, the upper encapsulation layer 464 can also be employed in spacer formation to create sidewall spacers that include portions of the upper encapsulation layer 464. The upper layer can be removed from the extension and S/D regions by a spacer etch process that stops at the lower encapsulation layer. This could be beneficial in the case where the extension implants need to be performed on bare silicon. The presence of the upper layer on the gate sidewalls prevents the high-k film sidewalls to be exposed when the extension regions are deglazed.

In view of the foregoing structural and functional features described supra, methodologies in accordance with various aspects of the present invention will be better appreciated with reference to the above figures. While, for purposes of simplicity of explanation, the methodology of FIG. 5, below, is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 5:
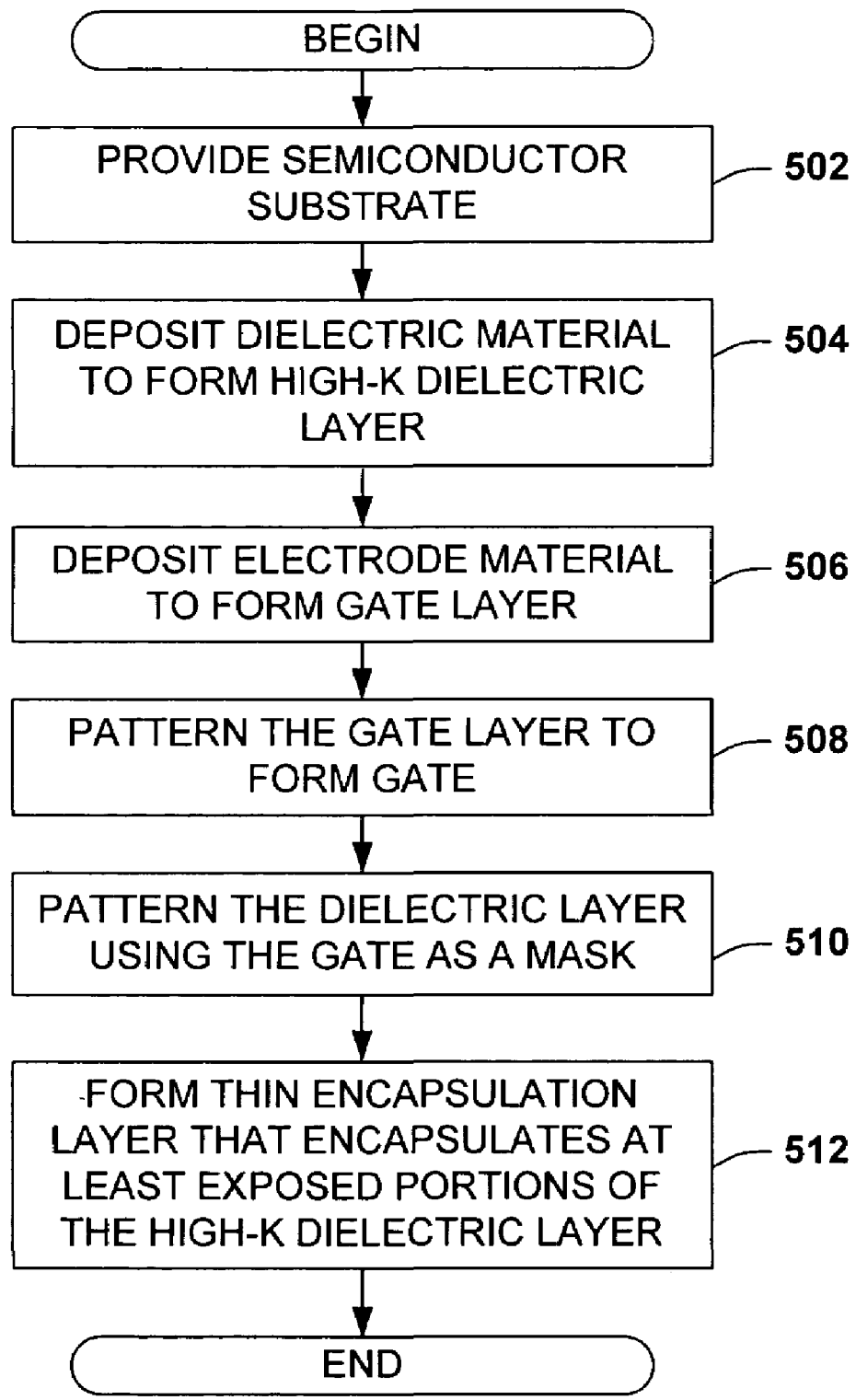
FIG. 5 is a flow diagram illustrating a method of fabricating a gate structure with an encapsulated dielectric layer in accordance with an aspect of the present invention.

FIG. 5 is a flow diagram illustrating a method of fabricating a gate structure with an encapsulated dielectric layer in accordance with another aspect of the present invention is provided. Exposed portions of the dielectric layer are encapsulated to mitigate defects in the dielectric layer and also to reduce contamination of process tools by the dielectric layer.

The method begins at block 502, wherein a semiconductor substrate is provided. Isolation structures, such as STI regions, well regions are also typically formed to define individual devices on the substrate.

High-k dielectric material is then deposited on the device at block 504 to form a high-k dielectric layer. The high-k dielectric material has a dielectric constant greater than that of $SiO_2$ (e.g., greater than about 3.9). Examples of suitable materials are discussed supra. A suitable deposition process, such as, chemical vapor deposition (CVD), physical vapor deposition (PVD), atomic layer deposition (ALD), molecular beam epitaxy (MBE), and the like is employed to form the high-k dielectric layer. The deposition process is performed so as to obtain an actual dielectric layer thickness, which corresponds to a desired or selected equivalent oxide thickness (EOT) for the high-k dielectric layer.

Gate electrode material is then deposited on the high-k dielectric layer to form a gate layer at block 506. The deposited electrode material is a suitable conductive material including, but not limited to, polysilicon, metals, metal silicides, metal oxides, metal nitrides, or stacks combinations thereof. A suitable deposition process, such as CVD, PVD, and ALD, is employed to deposit the conductive material that forms the gate layer. Additionally, the material can be doped or undoped.

The gate layer is patterned at block 508 to form a gate. A suitable mask and etch process is employed to selectively remove portions of the gate layer leaving remaining portions as the gate. The high-k dielectric layer is not substantially etched at block 508. The high-k dielectric layer is then patterned at block 510 to remove portions of the high-k dielectric layer from source/drain regions. The gate can be utilized as a mask for a suitable etch process, such as a wet etch as described in U.S. Pat. No. 6,656,852 assigned to the assignee of the present invention, Texas Instruments Incorporated, the entirety of which is hereby incorporated by reference as if fully set forth herein. Different chemistries can be employed for the etch processes utilized in blocks 508 and 510.

A relatively thin encapsulation layer is formed on at least exposed portions of the high-k dielectric layer at block 512. Generally, the encapsulation layer is formed over the device by a blanket type process. A suitable exemplary thickness is about 10 to 300 Angstroms for the encapsulation layer. The encapsulation layer can be formed by depositing a thin layer of oxide (e.g., about 10 to 100 Angstroms) and, optionally, a relatively thin layer of nitride (e.g., about 10 to 200 Angstroms).

Standard processing can then be performed to complete fabrication of the device including extension region formation, spacer formation, source/drain region formation, silicide formation, interconnect formation, and the like. If the nitride layer is formed as part of the encapsulation layer, extension regions can be formed before or after formation of the nitride layer and still be in accordance with the present invention. The nitride layer can also act as an etch stop in other processing steps, such as sidewall spacer formation. Additionally, the nitride layer, if present, can be utilized as part of the sidewall spacers (e.g., via an anisotropic etch).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a gate structure having an encapsulated dielectric layer comprising:

depositing a high-k dielectric material over a semiconductor substrate to form a high-k dielectric layer;

depositing electrode material on the high-k dielectric layer to form a gate layer;

patterning the gate layer to form a gate;

patterning the high-k dielectric layer to remove portions covering source and drain regions of the semiconductor substrate;

forming a lower portion of an encapsulation layer by depositing oxide over the device;

forming an upper portion of the encapsulation layer by depositing nitride over the device, wherein the encapsulation layer covers exposed portions of the high-k dielectric layer; and forming extension regions after forming the encapsulation layer.

2. The method of claim 1, wherein patterning the high-k dielectric layer comprises employing the formed gate as a mask during etching.

3. The method of claim 1, wherein the electrode material deposited is a material selected from the group comprising polysilicon, metals, metal suicides, metal oxides, metal nitrides, and combinations thereof.

4. The method of claim 1, wherein the electrode material is deposited by a chemical vapor deposition process.

5. A method for fabricating a semiconductor device with an encapsulated dielectric layer comprising:
    forming a high-k dielectric layer on a semiconductor substrate;
    forming a polysilicon layer on the high-k dielectric layer;
    patterning the polysilicon layer to form polysilicon gates;
    separately patterning the high-k dielectric layer to remove portions of the high-k dielectric layer over source/drain regions defining gate structures from remaining portions of the high-k dielectric layer and the polysilicon gates;
    depositing an encapsulation layer over the device that encapsulates the gate structures including exposed portions of the high-k dielectric layer;
    forming extension regions after forming the encapsulation layer;
    forming sidewall spacers on sidewalls of the gate structures; and
    forming source and drain regions within the semiconductor substrate by selectively implanting suitable dopants.

6. The method of claim 5, wherein the formed polysilicon is doped.

7. The method of claim 5, wherein the encapsulation layer is formed by depositing a lower oxide layer and an upper nitride layer.

8. The method of claim 7, wherein the lower oxide layer is formed with a thickness of about 10 to 100 Angstroms and the upper nitride layer is formed with a thickness of about 10 to 200 Angstroms.

9. A method for fabricating a semiconductor device with an encapsulated dielectric layer comprising:
    forming a high-k dielectric layer over a semiconductor substrate;
    forming a gate electrode layer on the high-k dielectric layer;
    patterning the gate electrode layer to form gates;
    patterning the high-k dielectric layer to remove portions of the high-k dielectric layer over source/drain regions defining gate structures from remaining portions of the high-k dielectric layer and the gates;
    depositing an encapsulation layer over the device that encapsulates the gate structures including exposed portions of the high-k dielectric layer;
    forming extension regions after forming the encapsulation layer;
    forming sidewall spacers on sidewalls of the gate structures; and
    forming source and drain regions within the semiconductor substrate by selectively implanting suitable dopants.

10. The method of claim 9, further comprising removing a portion of the encapsulation layer prior to forming extension regions.

11. The method of claim 10, wherein the removed portion of the encapsulation layer is substantially comprised of nitride.

12. The method of claim 9, wherein the step of forming the sidewall spacers comprises:
    forming an insulative spacer layer over the device after forming the extension regions; and
    patterning the spacer layer.

13. The method of claim 9, further comprising patterning portions of the encapsulation layer when forming the sidewall spacers, wherein the formed sidewall spacers at least partially comprise remaining portions of the encapsulation layer.

14. The method of claim 9, wherein patterning the gate electrode layer is performed with a first etch chemistry and wherein patterning the high-k dielectric layer is performed with a second etch chemistry that is distinct from the first etch chemistry.

15. The method of claim 9, wherein forming the high-k dielectric layer comprises depositing a dielectric material having a dielectric constant greater than that of silicon dioxide.

16. The method of claim 15, wherein the deposited dielectric material is hafnium silicon oxynitride.

17. The method of claim 9, wherein the gate electrode layer comprises a material selected from the group comprising silicon, metals, metal suicides, metal oxides, metal nitrides, and combinations thereof.

18. The method of claim 9, wherein the encapsulation layer is formed by depositing a thin layer nitride with thickness of about 10 to 200 Angstroms.

19. The method of claim 9, wherein the encapsulation layer is formed to have a thickness of about 10 to 300 Angstroms.

* * * * *